United States Patent [19]

Rupp

[11] Patent Number: 5,691,951
[45] Date of Patent: Nov. 25, 1997

[54] STAGGERED ROW LINE FIRING IN SINGLE RAS CYCLE

[75] Inventor: James P. Rupp, Boise, Id.

[73] Assignee: Micron Technology, Inc., Boise, Id.

[21] Appl. No.: 743,476

[22] Filed: Nov. 4, 1996

[51] Int. Cl.[6] ................................. G11C 8/00; G11C 7/00
[52] U.S. Cl. ........................ 365/230.06; 365/194
[58] Field of Search ........................... 365/230.06, 194, 365/149

[56] References Cited

U.S. PATENT DOCUMENTS

| | | | |
|---|---|---|---|
| 4,885,720 | 12/1989 | Miller et al. | 365/230.06 |
| 5,274,591 | 12/1993 | Waller et al. | 365/189.05 |
| 5,291,443 | 3/1994 | Lim | 365/189.04 |
| 5,297,087 | 3/1994 | Porter | 365/201 |
| 5,381,368 | 1/1995 | Morgan et al. | 365/189.01 |
| 5,440,517 | 8/1995 | Morgan et al. | 365/202 |
| 5,625,790 | 4/1997 | Cutter | 365/230.06 |

*Primary Examiner*—David C. Nelms
*Assistant Examiner*—Trong Quang Phan
*Attorney, Agent, or Firm*—Schwegman, Lundberg, Woessner & Kluth, P.A.

[57] ABSTRACT

A row decoder circuit operates in a memory integrated circuit, such as a dynamic random access memory (DRAM), having an array of memory cells including row and columns. An address decode tree circuit receives address signals and provides decode signals being activated based on the state of the address signals. Row line driver circuits receive corresponding ones of the decode signals and an enable signal. Each row line driver circuit fires a corresponding row line when the enable signal is activated and the corresponding one of the decode signals is activated. Delay circuitry delays certain of the address signals to stagger the activation of certain of the decode signals to permit multiple row lines to fire in a single row address strobe (RAS) cycle.

22 Claims, 6 Drawing Sheets

STAGGERED ROW LINE FIRING IN SINGLE RAS CYCLE

THE FIELD OF THE INVENTION

The present invention relates generally to integrated circuits, and more particularly to row line driver circuits in memory integrated circuits, such as dynamic random access memories (DRAMs).

BACKGROUND OF THE INVENTION

A typical dynamic random access memory (DRAM) is comprised of an array of individual memory cells. Typically, each memory cell comprises a capacitor capable of holding a charge and an access transistor for accessing the capacitor charge. The charge is representative of a data bit and can be either a high voltage or a low voltage. Data can be either stored in the memory cells during a write mode, or data may be retrieved from the memory cells during a read mode. The data is transmitted on signal lines, referred to as digit lines, which are coupled to input/output (I/O) lines through switching transistors. For each bit of data stored, its true logic state is available on an I/O line and its complementary logic state is available on an I/O complement line. Thus, each memory cell has two digit lines, digit and digit complement, but each memory cell is only connected to one of either the digit or digit complement.

Typically, the memory cells are arranged in an array and each cell has an address identifying its location in the array. The array comprises a configuration of intersecting rows and columns and a memory cell is associated with each intersection. In order to read from or write to a cell, the particular cell must be selected, or addressed. The address for the selected cell is represented by input signals to a row decoder circuit and to a column decoder circuit. The row decoder circuit activates a word line or row line in response to the row address. The selected word line activates the access transistors for each of the memory cells in communication with the selected word line. Each such memory cell shares charge with its associated digit or digit complement, creating a small voltage differential between the digit and digit complement. This voltage differential is amplified and latched on the digit pair. The column decoder circuit selects a digit line pair for reading or writing in response to the column address and connects the digit and digit complement to the I/O pair by means of the switching transistor.

Conventional DRAMs use memory cells fabricated as capacitors in an integrated circuit to store data where, for example, a logical "1" is stored as a charge on the capacitor and the capacitor is discharged for a logical "0". The pairs of digit lines are fabricated as metal lines on the integrated circuit and connected to the memory cells for transmitting data stored in the memory cells. Sense amplifiers are utilized to sense small differentials on the digit lines and drive the digit lines to full power supply rails for either reading or writing the memory cells.

Row decoder circuits include multiple row decode blocks comprising row (word) line drivers and address decoder trees. A row line driver provides a high output voltage in response to a received equal to or lower input voltage. Certain types of row line drivers source and/or sink current through their input. As a result, one problem with row line drivers is that an arbitrary number of rows cannot typically be raised in a single row address strobe (RAS) cycle. The address decoder tree permits only a limited amount of current to pass through to the row line driver when many rows are selected at a given time. Consequently, there may be insufficient current into or out of a given row line driver to switch the row line driver and a misfire of selected row lines occurs.

In normal non-test mode operations typically only one or two rows are selected in a given RAS cycle, thus the problem of not being able to raise multiple row lines in a given RAS cycle is not significant. However, during certain test modes, there is a desire to address and fire all rows in one RAS cycle. Currently, however, the rows must be fired in multiple cycles because there is not sufficient current to raise all or many row lines in one RAS cycle. Moreover, electro-migration failures may occur when multiple row line drivers fire at the same time became of preferred layout designs.

Therefore, for the reasons stated above, and for other reasons presented in greater detail in the Description of the Preferred Embodiments section of the present specification, there is a need in the art for a memory-integrated circuit, such as a DRAM, to include row decoder circuitry which permits multiple rows to fire in a single RAS cycle.

SUMMARY OF THE INVENTION

The present invention provides a method and a row decoder circuit in a memory integrated circuit having an array of memory cells including row and columns. An address decode tree circuit receives address signals and provides N decode signals, which are activated based on the state of the address signals. N row line driver circuits each receives a corresponding one of the N decode signals and an enable signal. Each row line driver circuit fires a corresponding row line when the enable signal is activated and the corresponding one of the N decode signals is activated. Delay circuitry is coupled to the address signals to delay certain of the address signals to stagger the activation of certain of the decode signals.

In one preferred embodiment of the present invention where each row line driver circuit has a row line switching current which sources and/or sinks current through at least one of its received input signals, the delay circuitry delays the certain of the address signals to permit multiple row lines to fire in a single row address strobe (RAS) cycle. The delay circuitry sufficiently delays the certain of the address signals to permit row line current to die down to a level which allows the next to fire row line driver circuits to fire. In this way, the delay circuit delays the certain of the address signals so that only selected number M of the N row line driver circuits are fired in a given time period.

In one embodiment of the present invention, the enable signal is activated at least by a first time and at least a first decode signal is activated at least by the first time. The delay circuitry operates to cause at least a second decode signal to be activated at a second time which occurs after the first time and at least a third decode signal to be activated at a third time which occurs after the second time. The first, second, and third times all occur in a single RAS cycle.

The circuitry and method according to the present invention permits all row lines of a memory array to be activated in one RAS cycle. Therefore, in certain test modes all rows of the memory array are testable in the single RAS cycle. This is in contrast to conventional methods and circuitry where multiple RAS cycles are needed to test all the rows of the a memory array. Furthermore, the method and circuitry of the present invention of staggering row line firings in one RAS cycle, reduces any instantaneous current on the Vccp bus by the percentage of row line firings, in relation to the total number of row lines that could fire. Accordingly, this prevents or substantially reduces the number of electro-migration failures that may occur when multiple row line drivers fire at the same time because of preferred layout designs.

DESCRIPTION OF THE PREFERRED EMBODIMENTS

In the following detailed description of the preferred embodiments, reference is made to the accompanying drawings which form a part hereof, and in which is shown by way of illustration specific embodiments in which the invention may be practiced. It is to be understood that other embodiments may be utilized and structural or logical changes may be made without departing from the scope of the present invention. The following detailed description, therefore, is not to be taken in a limiting sense, and the scope of the present invention is defined by the appended claims.

The following described embodiments of the present invention are described as applied to a dynamic random access memory (DRAM). The DRAM according to the present invention is similar in many respects to conventional DRAMs, Such as those commercially available from Micron Technology, Inc. of Boise, Id.. For clarity, only a portion of the well known circuitry of the DRAM is described herein, while the new circuitry of the DRAM of the present invention is described in detail herein.

Figure 1:
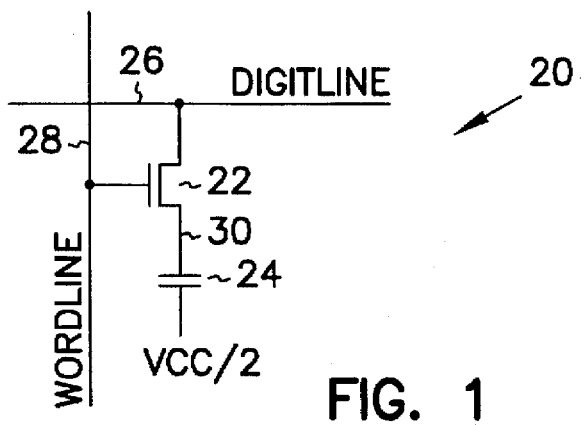
FIG. 1 is a schematic diagram of a dynamic random access memory (DRAM) memory cell or memory bit.

A DRAM memory cell or memory bit is schematically illustrated generally at 20 in FIG. 1. Memory cell 20 comprises a transistor 22 and a capacitor 24. Memory cell 20 is capable of holding binary information in the form of stored charge on capacitor 24. Transistor 22 operates as a switch coupled between capacitor 24 and a digit line 26. Capacitor 24 includes a common node which is biased at approximately Vcc/2 or at the cell plate voltage. The gate which controls the switching action of transistor 22 is coupled to a word line 28. A logic 1 binary value is stored in memory cell 20 by having a plus Vcc/2 charge across capacitor 24. A logic 0 binary value is stored in memory cell 20 by having a minus Vcc/2 charge across capacitor 24. Thus, a node 30, representing the connection between transistor 22 and capacitor 24, is at a potential equal to Vcc when a logic 1 value is stored in memory array 20 and is at a zero or a ground level potential when a logic 0 value is stored in memory cell 20.

Figure 2:
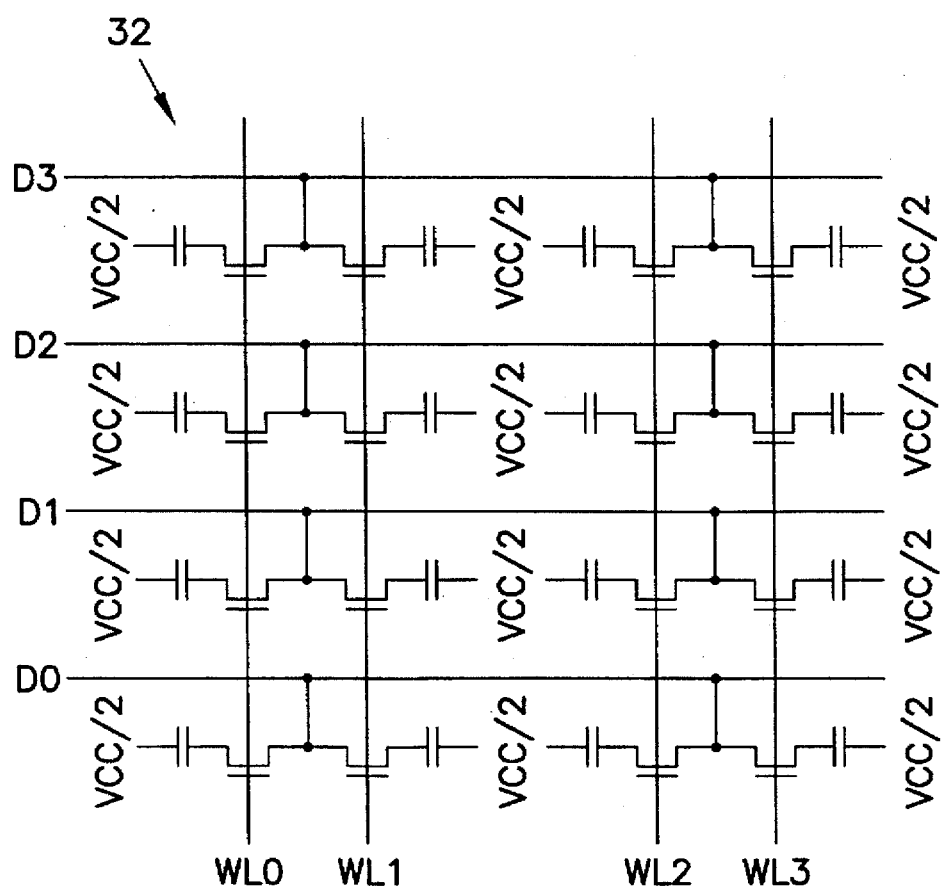
FIG. 2 is schematic diagram of a simplified memory array structure of a DRAM.

Memory arrays in DRAMs are formed by tiling a number of memory cells, such as memory cell 20, together such as schematically illustrated in FIG. 2. In FIG. 2, a simplified memory array structure is generally illustrated at 32. In memory array structure 32, the memory cells along a given digit line (D0, D1, D2, or D3) do not share a common word line (WL0, WL1, WL2, or WL3) and memory cells along a common word line do not share a common digit line. The simplified diagram of memory array structure 32 in FIG. 2 is for illustrative purposes only to show how the one transistor/one capacitor memory cells are employed in an array structure which is easily scaled. Although the design of the DRAM memory cells and memory arrays may appear simple, their actual design and implementation are highly complex.

Figure 3:
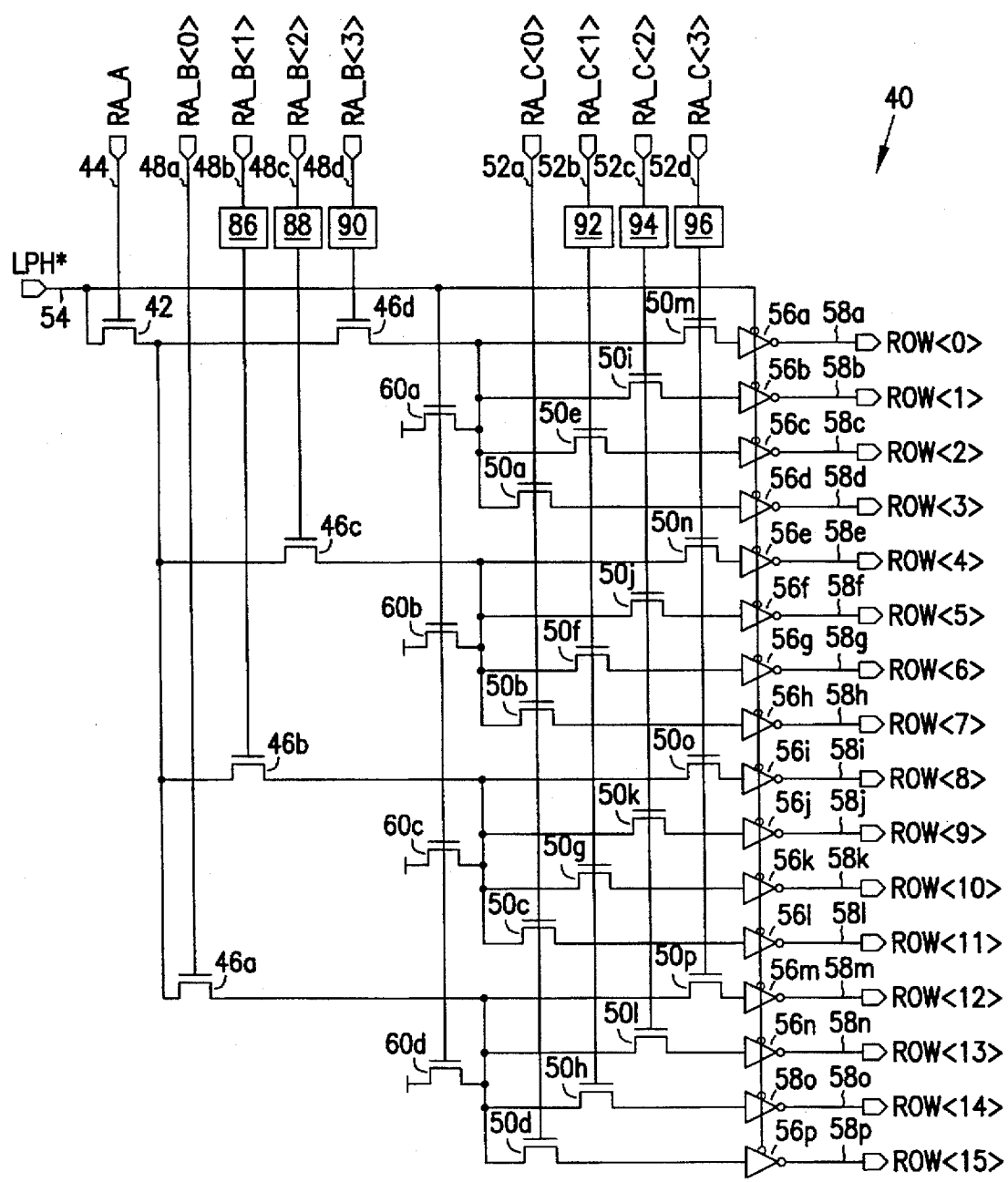
FIG. 3 is a schematic and block diagram of a row decoder circuit of a DRAM according to the present invention.

A row decoder circuit 40 according to the present invention is illustrated in schematic diagram form in FIG. 3. Row decoder circuit 40 includes a top level decoding transistor 42 which is gated by an address signal RA_A received on an address line 44. Four middle level decoding transistors 46a–46d are gated by address signals RA_B (0:3), respectively, which are received on address lines 48a–48d, respectively. Sixteen bottom level decoding transistors 50a–50p are gated by address signals RA_C (0:3) which are received on address lines 52a–52d, respectively. Address signal RA_C (0) gates bottom level decoding transistors 50a–50d. Address signal RA_C (1) gates bottom level decoding transistors 50e–50h. Address signal RA_C (2) gates bottom level decoding transistors 50i–50l. Address signal RA_C (3) gates bottom level decoding transistors 50m–50p.

The address signals RA_B and RA_C are a one of four decoding with typically only one address normally active. Therefore, the decoding levels of the address decode tree of row decoder circuit 40 are arranged in a quad-ary tree structure with each of the sixteen leaves of the address decode tree driving a row (word) line inverter driver circuit, indicated at 56a–56p. A phase signal LPH* is provided on a line 54 and gates enable transistors 60a–60d and is provided to row line inverter driver circuits 56a–56p. The phase signal LPH* on line 54 being brought to a low logic level causes a corresponding row line inverter driver circuit 56 selected by the address signal inputs to activate a decoded row line corresponding to the selected row line inverter driver circuit. Row line driver circuits 56a–56p respectively activate or fire row lines (0:15), indicated at 58a–58p.

Figure 4:
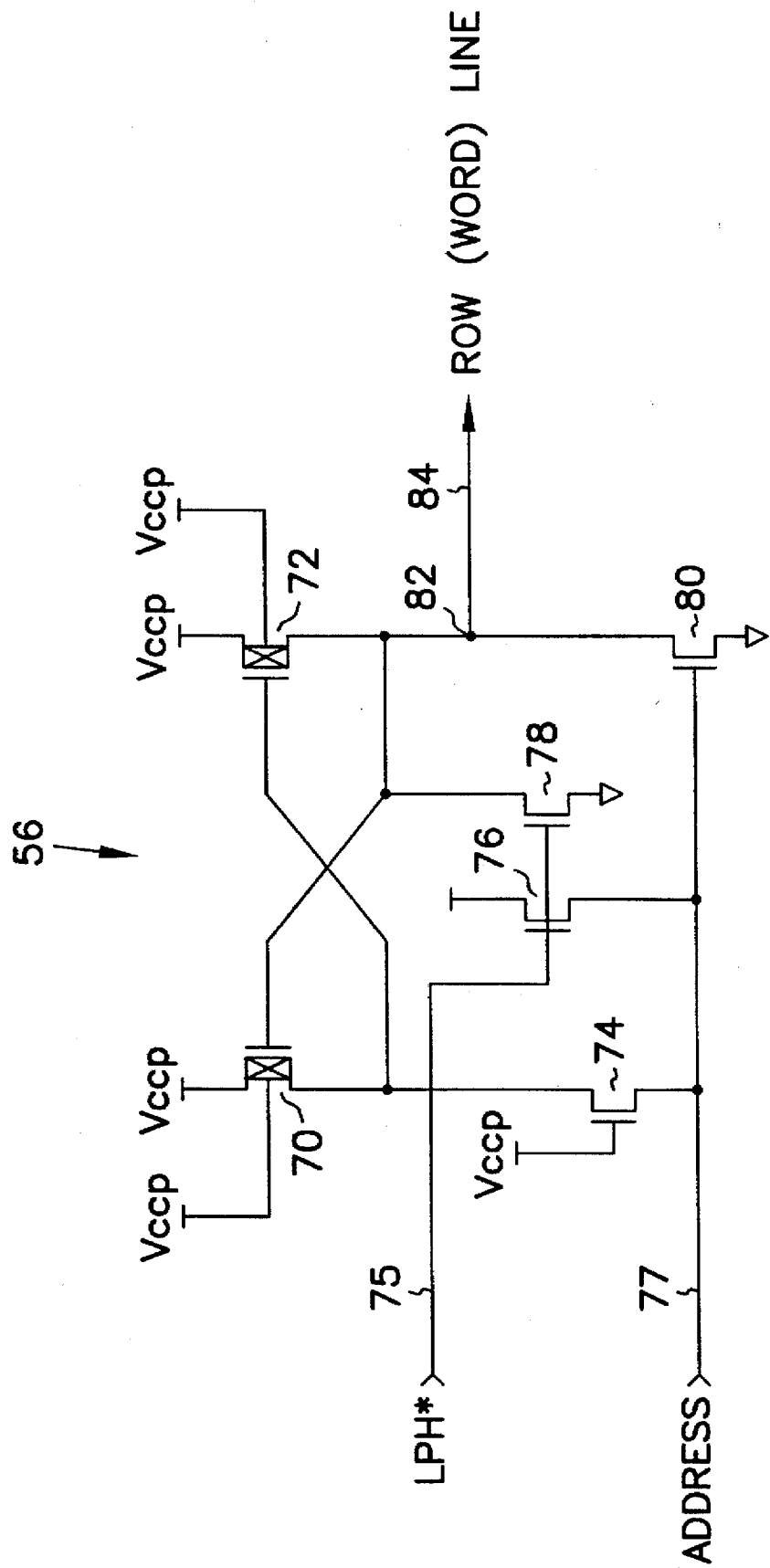
FIG. 4 is schematic diagram of a row line inverter driver circuit employed in the row decoder circuit of FIG. 3.

A more detailed schematic diagram of row line inverter driver circuit 56 is illustrated in FIG. 4. The complementary metal oxide semiconductor (CMOS) row line driver circuit 56 is configured in a conventional layout of such a row line driver circuit. Row line driver circuit 56 includes p-channel transistors 70 and 72. P-channel transistors 70 and 72 have their sources coupled to the boosted word line voltage (Vccp). The gate and drains of P-channel transistors 70 and 72 are cross coupled together to form a latch. An N-channel transistor 74 has its gate coupled to Vccp, its source coupled to an address gated phase signal on a line 77, and its drain coupled to the drain of transistor 70 and the gate of transistor 72. An N-channel transistor 76 has its gate coupled to the LpH* signal on a line 75, its source coupled to Vccp, and its drain coupled to the address gated phase signal on line 77. An N-channel transistor 78 has its gate coupled to the LPH* signal on line 75, its source coupled to ground, and its drain coupled to the gate of transistor 70 and the drain of transistor 72. An N-channel transistor 80 has its gate coupled to the address gated phase signal on line 77, its source coupled to ground, and its drain coupled to the gate of transistor 70 and the drain of transistor 72. An output node 82 couples together the gate of transistor 70, the drain of transistor 72, the drain of transistor 78, and the drain of transistor 80. Output node 82 drives a row (word) line 84 to the DRAM memory cells.

As illustrated, the LPH* and the address gated phase signal are combined to drive the output stage of row line driver circuit 56. Row line driver circuit 56 operates in a known manner to provide a high output voltage to the row line 84 based on the LPH* signal on line 75 being brought low and the corresponding address gated phase signal on line 77 being activated.

Referring back to FIG. 3, the RA_B (1) address signal is coupled to the gate of middle level decoding transistor 46b though a delay circuit 86. The RA_B (2) address signal is coupled to the gate of middle level decoding transistor 46c though a delay circuit 88. The RA_B (3) address signal is coupled to the gate of middle level decoding transistor 46d though a delay circuit 90. The RA_C (1) address signal is coupled to the gates of the bottom level decoding transistors 50e–50h through a delay circuit 92. The RA_C (2) address signal is coupled to the gates of the bottom level decoding transistors 50i–50l through a delay circuit 94. The RA_C (3) address signal is coupled to the gates of the bottom level decoding transistors 50m–50p through a delay circuit 96. The operation of the delay circuits 86, 88, 90, 92, 94, and 96 to permit staggered firing of row lines in a single row address strobe (RAS) cycle is described below.

As discussed in the Background of the Invention section, certain types of row line driver circuits, such as row line driver circuit 56, source and/or sink current through their input. Also, to fire row line driver circuit 56, the circuit requires that the latch formed by p-channel transistors 70 and 72 be overpowered by its input. Therefore, when multiple row lines are to be raised or activated in a single RAS cycle, problems arise with conventional methods and circuitry of row line drivers. For example, an operation of conventional method and circuitry (where delay circuits 86, 88, 90, 92, 94, and 96 are not employed) for firing multiple row lines in a single RAS cycle is illustrated in timing diagram form in FIG. 5. When multiple row lines are to be raised, the addresses not valid are made valid, which correspondingly selects multiple row lines when the LPH* signal is low. The address decode tree of row decoder circuitry 40 only permits a limited amount of current to pass through to the respective row line driver circuits 56. If the current at the top address node RA_A is at a maximum current level and the current into or out of the selected row line driver circuit 56 is not sufficient to overpower the latch formed by p-channel transistors 70 and 72, a misfire of the row line occurs.

Figure 5:
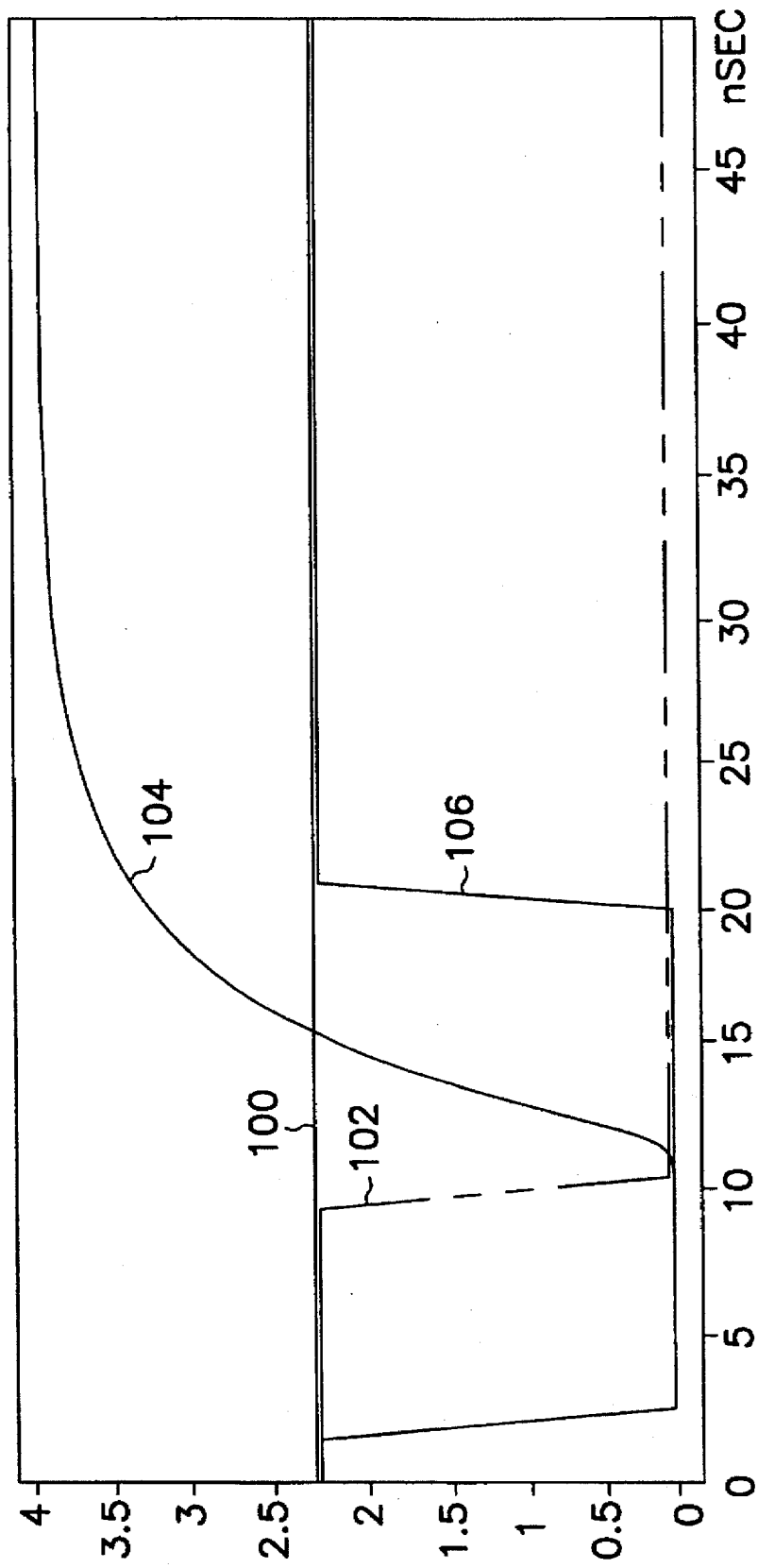
FIG. 5 is a timing diagram illustrating the operation of a row decoder circuit of when multiple row lines are selected at one time for firing in a single row address strobe (RAS) cycle.

As illustrated in the waveforms in the timing diagram of FIG. 5, the RA_A, RA_B (0), and RA_C (0) address signals, represented by waveform 100, are valid at approximately 0 nanoseconds (nSec). The LPH* signal, represented by waveform 102, is brought low at approximately 10 nSec. Row line driver circuit 56p correspondingly causes row line (15) to fire thereafter, as represented by waveform 104. When the RA_B (1:3) and RA_C (1:3) address signals, represented by waveform 106, are made valid at approximately 20 nSec, the corresponding row lines (0:14) should also fire. However, top level decoding transistor 42 only draws a limited amount of current and once that current limit is reached, the selected row lines are not activated because the LPH* signal cannot draw enough current through top level decoding transistor 42 to cause the selected row line driver circuits to fire.

Figure 6:
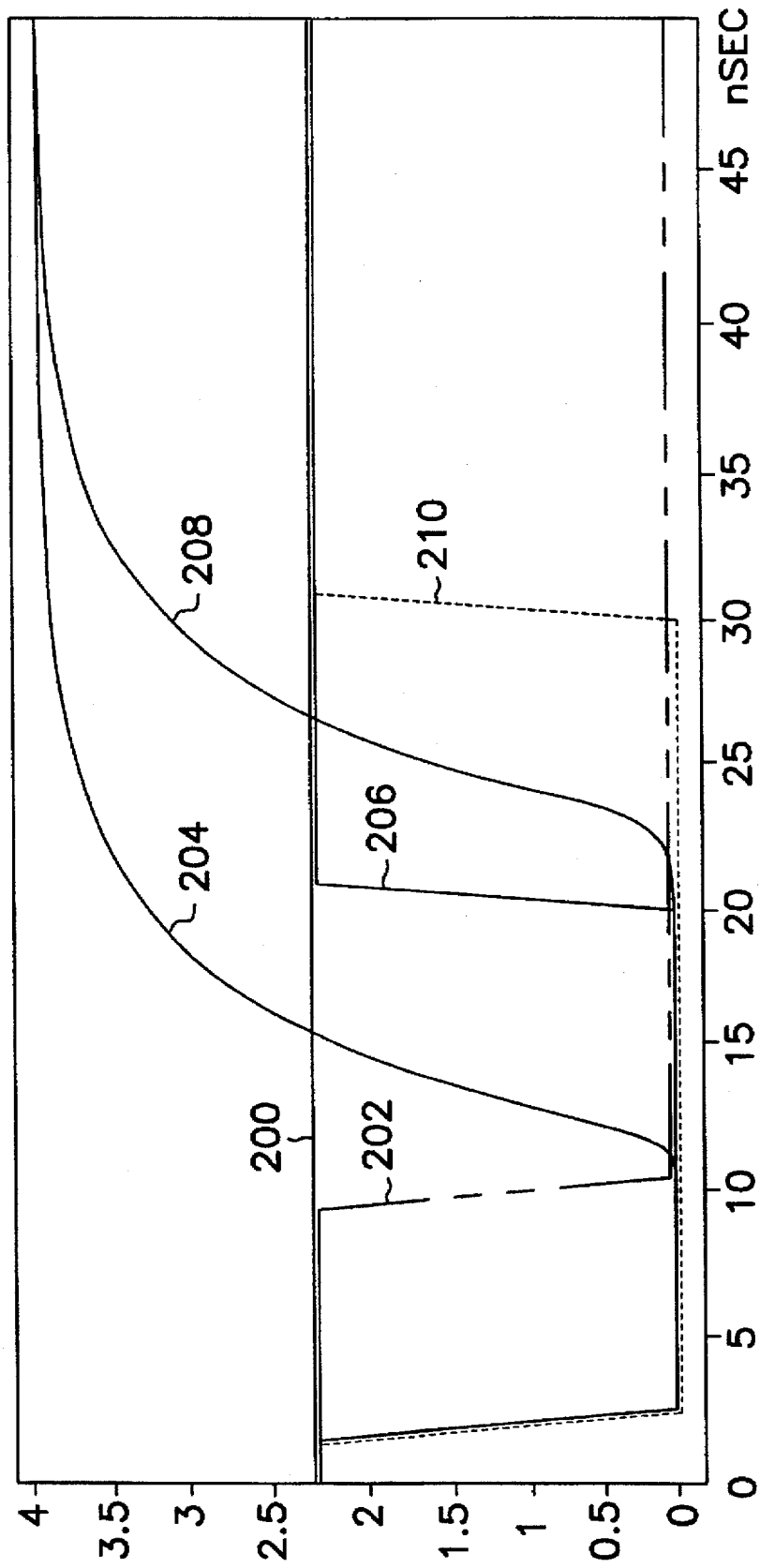
FIG. 6 is a timing diagram illustrating the operation of the row decoder circuit of FIG. 3 when multiple row lines are selected for firing in a single RAS cycle and the selection of row lines is somewhat staggered but not sufficiently staggered to permit all selected row lines to fire in a single RAS cycle.

A method and circuitry of the present invention staggers row line firings in order to prevent misfiring of rows. The staggering of row line firings is accomplished by selecting only certain addresses to be valid at any one given time during a RAS cycle. FIG. 6 illustrates a timing diagram where row line firings are staggered, but not sufficiently staggered to permit all selected row lines to fire in a single RAS cycle. As in FIG. 5, the RA_A, RA_B (0) and RA_C (0) address signals, represented by waveform 200, are all valid at approximately 0 nSec. At approximately 10 nSec, the LPH* signal, represented by waveform 202, is brought low. Row line driver circuit 56p correspondingly causes row line (15) to fire thereafter, as represented by waveform 204. At approximately 20 nSec, the RA_B (1:3) address signals, represented by waveform 206, become valid and row line driver circuits 56d, 56h, and 56l correspondingly cause row lines (3, 7, 11), represented by waveform 208, to fire thereafter. Nevertheless, at approximately 30 nSec, the RA_C address signals, represented by waveform 210, become valid after having been delayed by delay circuits 92, 94, and 96, but there is not sufficient current to allow the remaining row lines to fire.

Figure 7:
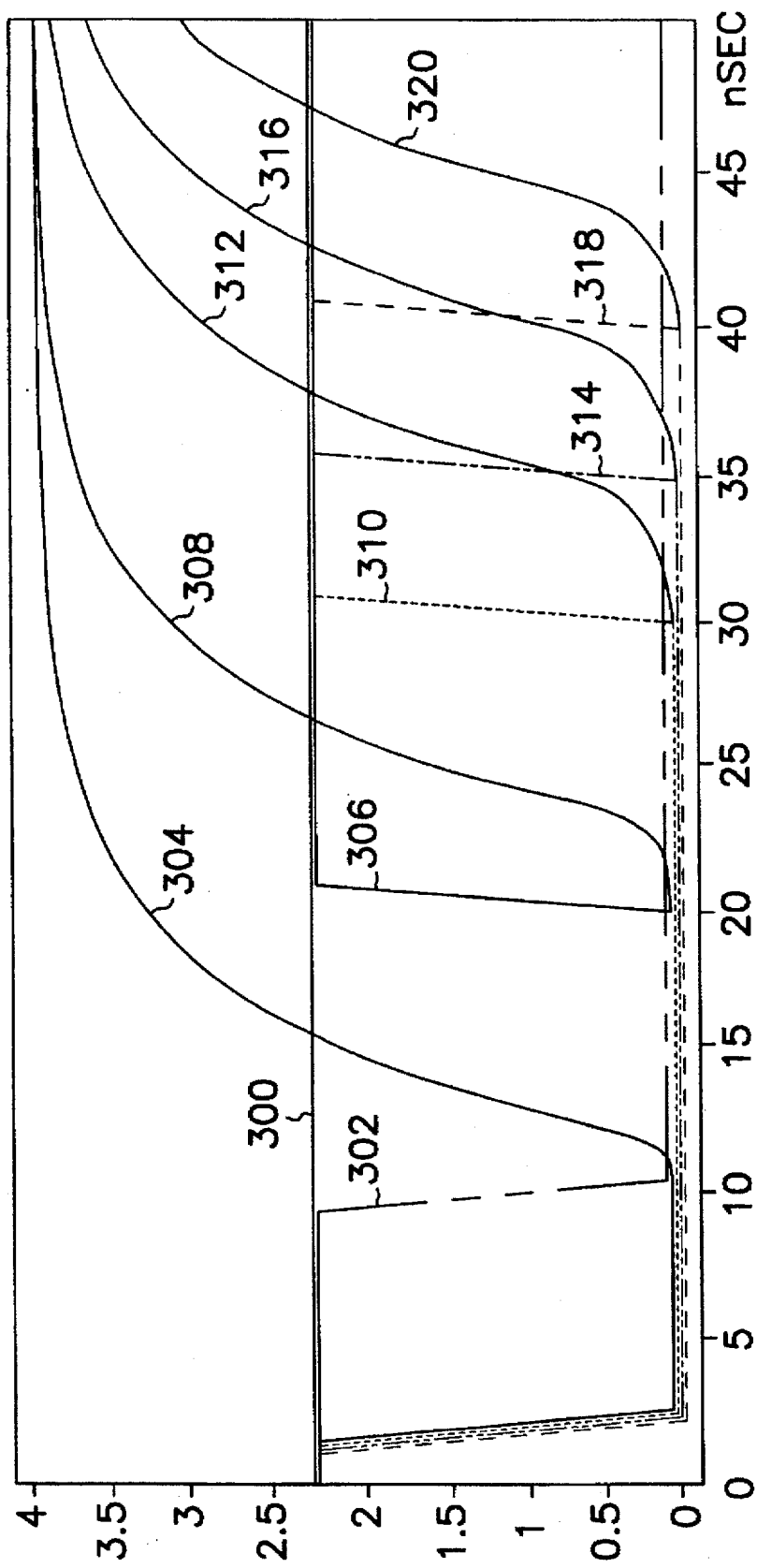
FIG. 7 is a timing diagram illustrating the operation of the row decoder circuit of FIG. 3 when multiple row lines are selected for firing in a single RAS cycle and the selection of row lines is staggered according to the present invention to permit all selected row lines to fire in a single RAS cycle.

FIG. 7 illustrates in timing diagram form the operation of the circuitry according to the present invention to permit all sixteen row lines (0:15) to fire in a single RAS cycle. As illustrated in FIG. 7, the RA_A, RA_B (0), RA_C (0) address signals, represented by waveform 300, become valid at approximately 0 nSec. The LPH* signal, represented by waveform 302, is brought low at approximately 10 nSec. Therefore, row line driver circuit 56p correspondingly causes row line (15) to fire thereafter, as represented by waveform 304. The RA_B (1:3) address signals, represented by waveform 306, are brought valid at approximately 20 nSec, after having been delayed by delay circuits 86, 88, and 90, and row line driver circuits 56d, 56h, and 56l correspondingly cause row lines (3, 7, 11), represented by waveform 308, to fire thereafter. At approximately 30 nSec, only the RA_C (1) address signal, represented by waveform 310, is brought valid, after having been delayed by delay circuit 92, and row line driver circuits 56c, 56g, 56k, and 56o correspondingly cause row lines (2, 6, 10, 14), represented by waveform 312, to fire thereafter. At approximately 35 nSec, only the RA_C (2) address signal, represented by waveform 314, is brought valid, after having been delayed by delay circuit 94, and row line driver circuits 56b, 56f, 56j, and 56n correspondingly cause row lines (1, 5, 9, 13), represented by waveform 316, to fire thereafter. Finally, at approximately 40 nSec, only the RA_C (3) address signal, represented by waveform 318, is brought valid, after having been delayed by delay circuit 96, and row line driver circuits 56a, 56e, 56i, and 56m correspondingly cause row lines (0, 4, 8, 12), represented by waveform 320, to fire thereafter.

Thus, as illustrated in FIG. 7, the method and circuitry of the present invention permits all of the row lines (0:15) to fire successfully in a single RAS cycle. As an additional benefit from using the method and circuitry of the present invention of staggered row line firings in one RAS cycle, any instantaneous current on the Vccp bus is reduced by the percentage of row line firings, in relation to the total number of row lines that could fire. Accordingly, this prevents or substantially reduces the number of electro-migration failures that may occur when multiple row line drivers fire at the same time because of preferred layout designs.

As to possible delay circuitry and methods to delay the firing of row lines, resistive capacitive (RC) delay networks, a number of logic gates, or other such known delay techniques can be employed to produce the proper delay in delay circuits 86, 88, 90, 92, 94, and 96. In one embodiment of the present invention, a combination of RC delay networks and logic gates are employed to delay the firing of selected row lines.

The five nSec delay between firings of the RA_C addresses illustrated in FIG. 7 represents the ideal case where there are no parasitic effects. When parasitic effects are taken into account, the row line firings necessarily need to be spread further apart. A preferred method to ascertain when a particular row line should fire is to measure the current flow through a row line driver circuit 56 and make sure the row line driver has already passed through its trip point. A sufficient delay is required to permit the row line current to die down to enable the next row line driver to receive a sufficient current to reach its trip point to cause the next row line to be activated. Typically, this occurs after the row line current dies down to approximately 75% of its peak value. In any event, the amount of delay can be optimized when laying out the die and/or based on SPICE simulation, or based on other known circuit design techniques and simulations tools.

Conclusion

By using the circuitry and method according to the present invention, all row lines of an array can be activated in one RAS cycle so that all rows of the array can be tested in the single RAS cycle. This is in contrast to previous designs where multiple RAS cycles are needed to test all the rows of the DRAM.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiments shown and described without departing from the scope of the present invention. Those with skill in the mechanical, electromechanical, electrical, and computer arts will readily appreciate that the present invention may be implemented in a very wide variety of embodiments. This application is intended to cover any adaptations or variations of the preferred embodiments discussed herein. Therefore, it is manifestly intended that this invention be limited only by the claims and the equivalents thereof.

What is claimed is:

1. A row decoder circuit in a memory integrated circuit having an array of memory cells including row and columns, the row decoder comprising:
   an address decode tree circuit receiving address signals and providing N decode signals being activated based on the state of the address signals;
   N row line driver circuits, each receiving a corresponding one of the N decode signals and an enable signal, and each row line driver circuit firing a corresponding row line when the enable signal is activated and the corresponding one of the N decode signals is activated; and
   delay circuitry coupled to the address signals to delay certain of the address signals to stagger the activation of certain of the decode signals.

2. The row decoder circuit of claim 1 wherein the delay circuitry delays the certain of the address signals to permit multiple row lines to fire in a single row address strobe (RAS) cycle.

3. The row decoder of claim 2 wherein the delay circuitry delays the certain of the address signals to permit up to all rows of the array of memory cells to be tested in the single RAS cycle.

4. The row decoder circuit of claim 1 wherein the delay circuitry sufficiently delays the certain of the address signals to permit a row line switching current to die down to a level which allows the next to fire row line driver circuits to fire.

5. The row decoder circuit of claim 1 wherein the enable signal is activated at least by a first time, wherein at least a first decode signal is activated at least by the first time, and wherein the delay circuitry operates to cause at least a second decode signal to be activated at a second time which occurs after the first time and at least a third decode signal to be activated at a third time which occurs after the second time, and wherein the first, second, and third times all occur in a single row address strobe (RAS) cycle.

6. The row decoder circuit of claim 1 wherein the delay circuit delays the certain of the address signals so that only a selected number M of the N row line driver circuits are fired in a given time period.

7. The row decoder circuit of claim 1 wherein each row line driver circuit has a row line switching current which sources and/or sinks current through at least one of its received input signals.

8. A memory integrated circuit comprising:
   a memory array having rows and columns, wherein a given row is addressed for reading or writing by firing a row line;
   an address decode tree circuit receiving address signals and providing N decode signals being activated based on the state of the address signals;
   N row line driver circuits, each receiving a corresponding one of the N decode signals and an enable signal, and each row line driver circuit firing a corresponding row line when the enable signal is activated and the corresponding one of the N decode signals is activated; and
   delay circuitry coupled to the address signals to delay certain of the address signals to stagger the activation of certain of the N decode signals.

9. The memory integrated circuit of claim 8 wherein the delay circuitry delays the certain of the address signals to permit multiple row lines to fire in a single row address strobe (RAS) cycle.

10. The memory integrated circuit of claim 9 wherein the delay circuitry delays the certain of the address signals to permit up to all rows of the memory array to be tested in the single (RAS) cycle.

11. The memory integrated circuit of claim 8 wherein the delay circuitry sufficiently delays the certain of the address signals to permit a row line switching current to die down to a level which allows the next to fire row line driver circuits to fire.

12. The memory integrated circuit of claim 8 wherein the enable signal is activated at least by a first time, wherein at least a first decode signal is activated at least by the first time, and wherein the delay circuitry operates to cause at least a second decode signal to be activated at a second time which occurs after the first time and at least a third decode signal to be activated at a third time which occurs after the second time, and wherein the first, second, and third times all occur in a single row address strobe (RAS) cycle.

13. The memory integrated circuit of claim 8 wherein the delay circuit delays the certain of the address signals so that only a selected number M of the N row line driver circuits are fired in a given time period.

14. The memory integrated circuit of claim 8 wherein the memory integrated circuit is a dynamic random access memory (DRAM).

15. The memory integrated circuit of claim 8 wherein each row line driver circuit has a row line driver switching current which sources and/or sinks current through at least one of its received input signals.

16. A method of firing multiple row lines in a single row address strobe (RAS) cycle in a memory integrated circuit having an array of memory cells including row and columns, the method comprising the steps of:

activating an enable signal at least by a first time, wherein the enable signal being activated causes a selected row line driver to fire a corresponding row line;

activating at least a first address signal at least by the first time, wherein the at least first address signal being activated selects at least a first row line driver to be fired;

activating at least a second address signal at a second time, which occurs after the first time wherein the at least second address signal being activated selects at least a second row line driver to be fired; and activating at least a third address signal at a third time which occurs after the second time, wherein the at least third address signal being activated selects at least a third row line driver to be fired, wherein the first, second, and third times all occur in a single RAS cycle.

17. A method of firing N row lines in a single row address strobe (RAS) cycle in a memory integrated circuit having an array of memory cells including row and columns, the method comprising the steps of:

activating an enable signal at least by a first time, wherein the enable signal being activated causes a selected row line driver to fire a corresponding row line;

activating address signals corresponding to the N rows;

decoding the activated address signals to provide N decode signals being activated based on the state of the address signals;

firing a corresponding row line when the enable signal is activated and the corresponding one of the N decode signals is activated; and delaying certain of the address signals to stagger the activation of certain of the decode signals.

18. The method of claim 17 wherein the delaying step delays the certain of the address signals to permit multiple row lines to fire in a single row address strobe (RAS) cycle.

19. The method of claim 17 wherein the delaying step sufficiently delays the certain of the address signals to permit a row line switching current to die down to a level which allows the next to fire row line driver circuits to fire.

20. The method of claim 17 wherein the delaying step causes at least a first decode signal to be activated at least by the first time, at least a second decode signal to be activated at a second time which occurs after the first time, and at least a third decode signal to be activated at a third time which occurs after the second time, and wherein the first, second, and third times all occur in a single row address strobe (RAS) cycle.

21. The method of claim 17 wherein the delaying step delays the certain of the address signals so that only a selected number M of the N row line driver circuits are fired in a given time period.

22. The method of claim 17 wherein the method is employed to test up to all rows of the memory integrated circuit in the single RAS cycle.

* * * * *